(12) United States Patent
Lin et al.

(10) Patent No.: US 10,541,132 B2
(45) Date of Patent: Jan. 21, 2020

(54) FORMING SEMICONDUCTOR STRUCTURES WITH TWO-DIMENSIONAL MATERIALS

(71) Applicants: Taiwan Semiconductor Manufacturing Co., Ltd., Hsinchu (TW); National Taiwan University, Taipei (TW)

(72) Inventors: Shih-Yen Lin, Tainan (TW); Hsuan-An Chen, Chiayi (TW); Si-Chen Lee, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 16/005,363

(22) Filed: Jun. 11, 2018

(65) Prior Publication Data
US 2019/0378715 A1    Dec. 12, 2019

(51) Int. Cl.
*H01L 29/24* (2006.01)
*H01L 21/02* (2006.01)
*H01L 29/16* (2006.01)
*H01L 29/267* (2006.01)

(52) U.S. Cl.
CPC .... *H01L 21/02417* (2013.01); *H01L 21/0242* (2013.01); *H01L 21/0262* (2013.01); *H01L 21/02378* (2013.01); *H01L 21/02381* (2013.01); *H01L 21/02568* (2013.01); *H01L 21/02631* (2013.01); *H01L 29/1608* (2013.01); *H01L 29/24* (2013.01); *H01L 29/267* (2013.01)

(58) Field of Classification Search
CPC .......... H01L 31/0324; H01L 21/02499; H01L 29/24
See application file for complete search history.

(56) References Cited

U.S. PATENT DOCUMENTS

| 2014/0353166 A1* | 12/2014 | Iezzi | B01J 37/0238 205/638 |
| 2016/0240719 A1* | 8/2016 | Lin | H01L 21/0262 |
| 2019/0139713 A1* | 5/2019 | Choi | B32B 15/04 |

OTHER PUBLICATIONS

Shengli Zhang, Zhong Yan, Yafei Li, Zhongfang Chen, and Haibo Zeng, Atomically Thin Arsenene and Antimonene: Semimetal-Semiconductor and Indirect_Direct Band-Gap Transitions, Angew. Chem. Int. Ed. 2015, 54, 3112-3115 (Year: 2015).*
Yufeng Song et al., 2017 2D Mater. 4 045010 (Year: 2017).*
Fortin-Deschênes et al., "Synthesis of Antimonene on Germanium," *Nano Letters* 17(8):4970-4975, 2017.
Pizzi et al., "Performance of arsenene and antimonene double-gate MOSFETs from first principles," *Nature Communications* 7:12585, 2016. (9 pages).

(Continued)

*Primary Examiner* — Jae Lee
(74) *Attorney, Agent, or Firm* — Seed IP Law Group LLP

(57) ABSTRACT

The current disclosure describes semiconductor devices, e.g., transistors, include a substrate, a semiconductor region including, at the surface, $MoS_2$ and/or other monolayer material over the substrate, and a terminal structure at least partially over the semiconductor region, which includes a different monolayer material grown directly over the semiconductor region.

18 Claims, 5 Drawing Sheets

(56) References Cited

OTHER PUBLICATIONS

Qiao et al., "High-mobility transport anisotropy and linear dichroism in few-layer black phosphorus," *Nature Communications* 5:4475, 2014. (7 pages).
Wu et al., "Epitaxial Growth and Air-Stability of Monolayer Antimonene on $PdTe_2$," *Advanced Materials* 29(11):1605407, 2017. (6 pages).

\* cited by examiner

FORMING SEMICONDUCTOR STRUCTURES WITH TWO-DIMENSIONAL MATERIALS

BACKGROUND

Technical Field

This disclosure relates generally to fabricating semiconductor structures, and in some embodiments, to a process for forming a semiconductor structure including two-dimensional materials.

Description of the Related Art

Two-dimensional (2D) materials have been a focus of recent research efforts to exploit their novel electronic properties and great potentials in semiconductor technologies, stimulated by the successful fabrication of graphene. Although graphene includes high carrier mobility value, its zero-bandgap nature, i.e., the semimetallic properties, limits its application in semiconductor devices. The 2D allotrope of black phosphorus, phosphorene, is another widely studied 2D material, which is expected to have high mobility values and visible bandgap. One disadvantage of phosphorene is its rapid degradation under the atmospheric condition.

BRIEF SUMMARY

Brief Description of the Several Views of the Drawings

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
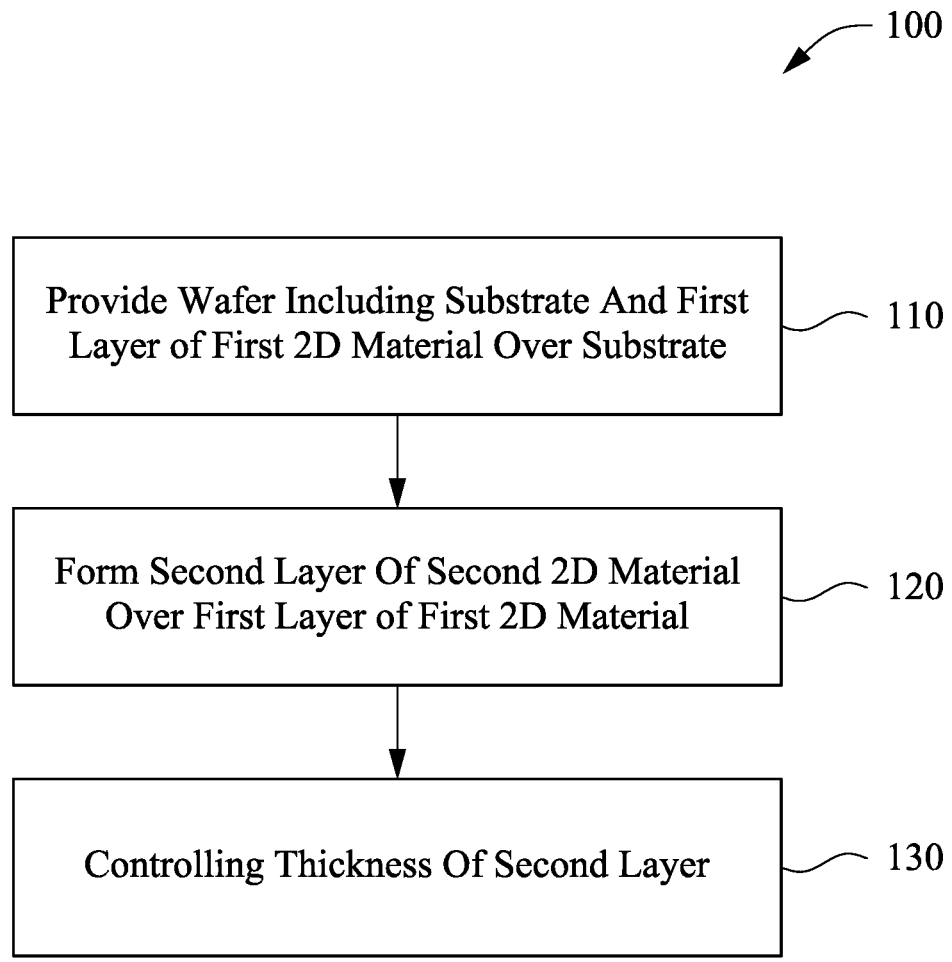
FIG. 1 illustrates an example process of making a 2D material according to embodiments of the disclosure.

Techniques in accordance with embodiments described herein are directed to a novel process to fabricate a 2D material. Embodiments of the current disclosure provide a base layer of a first 2D material and form a second different 2D material directly over the base layer of the first 2D material. Without intending to be bound by any particular theory, the present inventors believe that because the 2D material of the base layer does not have vertical bonding among atoms/molecules, the crystalline quality of the second 2D materials grown over the base layer is efficiently and effectively improved.

In an embodiment, a transition metal dichalcogenide (TMD) monolayer material is provided as a base for the growth of monolayer allotrope of antimony, i.e., antimonene. The antimonene growth may be effected through molecular beam epitaxy (MBE), physical vapor deposition (PVD) or other suitable forming approaches with a growth temperature ranging from room temperature to about 320° C. for a time duration ranging from about 10 seconds to about 600 seconds.

Alternatively or additionally, an annealing process may be performed on an antimony layer to re-crystalize the antimony into the layered structure. The annealing process may be carried out at a temperature within a range of about 200° C. to about 400° C. The annealing process may facilitate the growth of layered antimonene and/or may improve the crystalline quality of imperfectly grown antimonene layers. For example, an antimony layer may be grown through MBE, physical vapor deposition or other suitable forming approaches and then treated with the annealing process for a period of time suitable to generate layered antimonene, e.g., about 10 minutes.

The present techniques of fabricating antimonene described herein satisfactorily address the technical problems of antimonene desorption under higher growth temperatures, e.g., higher than 150° C. for MBE, and the problems of amorphous droplet formation, which prevents the formation of large scale antimonene flakes.

Further, van der Waals bonding force between the molecules of the first 2D material of the base layer and the molecules of the second 2D material grown over the base layer leads to satisfactory van der Waals heterostructure of the first 2D material and the second 2D material. Such van der Waals heterostructure may be readily taken advantage of in electronic devices, e.g., transistors, sensors and photonic devices.

In an embodiment, the first 2D material may be selected and/or treated to have desirable semiconductor electronic properties, e.g., direct band gap. The second 2D material grown over the first 2D material may be selected and/or treated to have semimetal electronic properties, e.g., zero band gap and electrically conductive.

Further, the second 2D material's electronic properties may include different states of semimetal, insulator and semiconductor depending on the thickness of the layers, namely, the number of monolayers of the second 2D material. The disclosed techniques also include controlling the thickness of the second 2D material grown over the first 2D material. In an example, the thickness of the second 2D material may be increased by prolonging the growth time. At least partially because of the van der Waals bonding force between the molecules of the first 2D material of the base layer and the molecules of the second 2D material, the thickness of the second 2D material may be reduced without damaging the heterostructure. In an embodiment, the thickness (i.e., layers) of the second 2D material may be effectively reduced by plasma based dry etching, e.g., reactive-ion etching.

In an embodiment, a device is made taking advantage of the current techniques of fabricating the second 2D material. A substrate and a first layer of a first 2D material over the substrate are provided. The first layer of the first 2D material exhibits semiconductor properties. A second layer of a second 2D material is formed directly over the first 2D material using, e.g., the techniques described herein. The second layer of the second 2D material exhibits a semimetal property. The first layer of the first 2D material is patterned to form a semiconductor region, e.g., channel region, of a device. The second layer of the second 2D material is patterned to form a terminal region, e.g., a source/drain region, of the device. With the 2D-2D interface between the first 2D material as the channel region and the second 2D material as the source/drain region, the contact resistance between the source/drain region and the channel region is substantially reduced and an Ohmic contact is effectively achieved.

The disclosure herein provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The following description references a transistor as an example of a semiconductor structure to which the present description applies; however, the present description is not limited in applicability to transistors. For example, the follow description applies to other types of semiconductor structures that are not transistors where the provision of low resistance electrical contact at junctions between features exhibiting semiconductor properties and features exhibiting electrical conductive properties, e.g., metal properties are desirable.

FIG. 1 illustrates an example fabrication process 100 of making a two-dimensional (2D) material. As used herein, consistent with the accepted definition within solid state material art, a "2D material" refers to a crystalline material consisting of a single layer of atoms. As widely accepted in the art, "2D material" may also be referred to as a "monolayer" material. In this disclosure, "2D material" and "monolayer" material are used interchangeably without differentiation in meanings, unless specifically pointed out otherwise.

Figure 2:
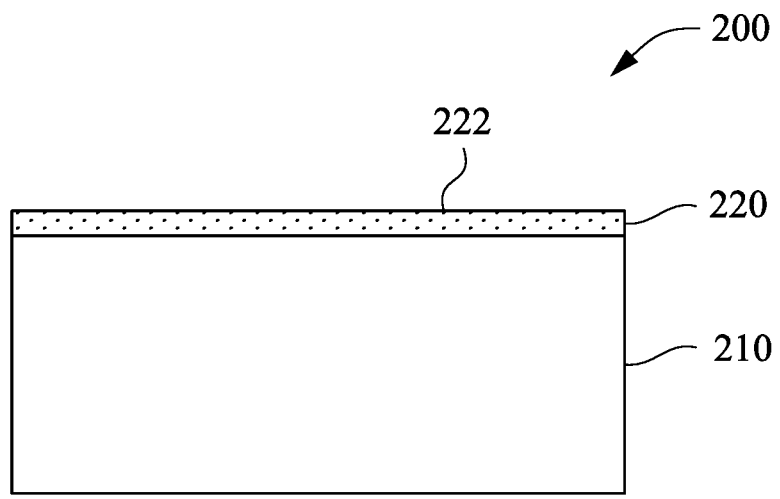
FIGS. 2-3 illustrate cross-sectional views of an example wafer at various stages of fabrication according to embodiments of the disclosure.

Referring to FIG. 1, with reference also to FIG. 2, at example operation 110, a wafer 200 is provided. Wafer 200 includes a substrate 210 and a first layer of a first 2D material. The first 2D material may be any 2D materials of any thickness. As appreciated, a 2D material includes a single layer of atoms in each of its monolayer structure, so the thickness of the 2D material refers to a number of monolayers of the 2D material, which can be one monolayer or more than one monolayer. The coupling between two adjacent monolayers of 2D material includes van der Waals forces, which are weaker than the chemical bonds between/among atoms within the single monolayer.

As first 2D layer 220 is provided for the growth of a second 2D layer thereover, in an embodiment, upper surface 222 of the first layer of the first 2D material includes no vertical bonding among atoms, at least for the portions of upper surface 222 where a second layer of a second 2D material will be grown.

In an embodiment, providing wafer 200 includes forming first layer 220 of the first 2D material over substrate 210. Forming of first 2D material 220 may include any suitable processes depending on the specific first 2D material 220 and the specific substrate 210. In an embodiment, the first 2D material includes a transition metal dichacogenide (TMD) monolayer material. As appreciated, a TMD monolayer includes one layer of transition metal atoms sandwiched between two layers of chalcogen atoms. Substrate 210 includes any substrates that are suitable for the formation of the TMD monolayers thereover. For example, substrate 210 may be selected based on its capacity to sustain the potential high temperature in the formation of the TMD monolayers thereover. In an embodiment, a sapphire substrate 210 is used. Other elementary semiconductors like germanium may also be used for substrate 210. Alternatively or additionally, substrate 210 includes a compound semiconductor such as silicon carbide, gallium arsenide, indium arsenide, indium gallium arsenide (InGaAs) and/or indium phosphide. Further, substrate 120 also includes a silicon-on-insulator (SOI) structure. Substrate 210 may also be other suitable substrates, which are all included in the disclosure and non-limiting. Substrate 210 may include an epitaxial layer and/or may be strained for performance enhancement. Substrate 210 may also include various doping configurations depending on design requirements, such as p-type substrate and/or n-type substrate and various doped regions such as p-wells and/or n-wells.

In an embodiment, the TMD monolayer 220 includes molybdenum disulfide ($MoS_2$). $MoS_2$ may be formed on substrate 210, e.g., a sapphire substrate, using any suitable approaches and all are included. For example, $MoS_2$ may be obtained through micromechanical exfoliation and coupled over substrate 210. In an embodiment, $MoS_2$ layer 220 is formed through sulfurizing a pre-deposited molybdenum (Mo) film over sapphire substrate 210 at a processing temperature ranging between about 600° C. to about 950° C.

In an embodiment, providing wafer 200 also includes treating first layer 220 of the first 2D material to obtain expected electronic properties of first layer 220 of the first 2D material. The treating processes include thinning (namely, reducing the thickness of first layer 220 of the first 2D material), doping, or straining, to make first layer 220 of the first 2D material exhibit certain semiconductor properties, e.g., including direct bandgap. The thinning of the first 2D material may be achieved through various suitable processes, and all are included in the present disclosure. In an example, plasma based dry etching, e.g., reaction-ion etching (ME), may be used to reduce the number of monolayers of the first layer 220 of the first 2D material.

In the description hereinafter, first layer 220 of a thin film of $MoS_2$ having semiconductor properties is used as an illustrative example for descriptive purposes. Each monolayer of $MoS_2$ is about 6.5 angstrom (A) in thickness. In an embodiment, the first layer 220 of $MoS_2$ is less than 1.5 nm in thickness, namely equal to or less than two monolayers of $MoS_2$ (bi-layer). It should be appreciated that other TMDs like molybdenum diselenide ($MoSe_2$) or other 2D materials like group V monolayers arsenene (As) and phosphorene (α-P) are also candidates for the first 2D material.

Figure 3:
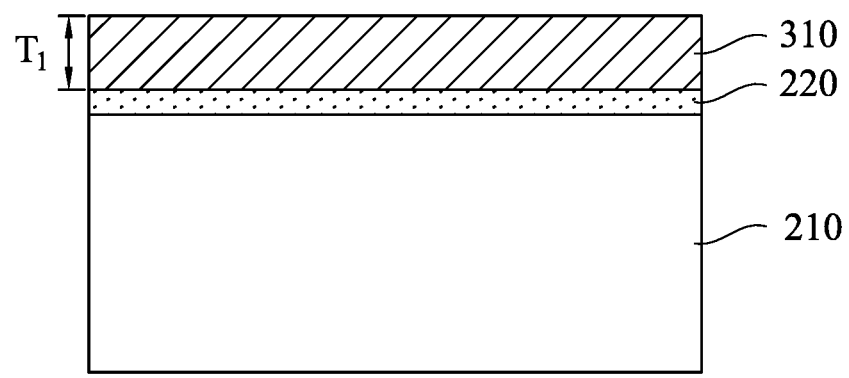

In example operation 120, with reference also to FIG. 3, a second layer 310 of a second 2D material is formed over first layer 220 of the first 2D material, e.g., $MoS_2$. The second 2D material is different from the first 2D material at least in the composition. The second 2D material may be any 2D material and may be deposited using any processes suitable for the specific 2D material. In an example, the second 2D material may be formed with a semimetal electronic property or may be treated to exhibit a semimetal property. As used herein, a semimetal electronic property ("semimetal property") refers to an absence of a bandgap and a negligible density of states at the Fermi level. A semimetal material or a semimetal state of a material has both holes and electrons that contribute to electrical conduction and is conductive.

In an example, the second 2D material is antimonene (Sb). Antimonene layer 310 may be formed over first layer 220 of $MoS_2$ using any suitable processes and all are included in the disclosure. In an embodiment, antimonene layer 310 may be grown over first layer 220 of $MoS_2$ using molecular beam epitaxy (MBE) or physical vapor deposition (PVD) processes with a growth temperature ranging from room temperature to about 320° C. for a time duration ranging from about 10 seconds to about 600 seconds. This growth temperature range is critical because such a high growth temperature is enabled by the use of the first layer 220 of $MoS_2$ as the base for the antimonene growth. Without the use of the $MoS_2$ base, the antimonene will desorb with growth temperature higher than 150° C. In an example, the growth temperature may be established by heating substrate 210 and first 2D layer 220 beforehand and the heating may be turned off when the formation of the antimonene layer 310 starts.

Alternatively and/or additionally, forming antimonene layer 310 over first layer 220 of $MoS_2$ includes growing a layer of antimony (not a monolayer state) over first layer 220 of $MoS_2$ using molecular beam epitaxy (MBE) or physical vapor deposition (PVD) processes under room temperature conditions, e.g., about 20° C., and then annealing the layer of antimony at an annealing temperature ranging from about 200° C. to about 400° C. for a sufficient period of time, e.g., about 7 to 15 minutes, to convert the antimony layer into a monolayer allotrope, antimonene. Test results have shown that annealing with this temperature range and time duration range results in better formation of antimonene sheets. "The deposition of the antimony layer may also be achieved using other suitable approaches including, but not limited to, thermal deposition processes like chemical vapor deposition (CVD), atomic layer deposition (ALD) and remote oxygen scavenging, molecular beam deposition, plasma processes like physical vapor deposition (PVD) and ionized PVD, plating, or other suitable process.

In an embodiment, the annealing process as described herein may also be adopted to cure imperfections in an antimonene layer obtained through other approaches. For example, antimonene layer 310 may be initially deposited over first layer 220 of $MoS_2$ using molecular beam epitaxy (MBE) or physical vapor deposition (PVD) processes with a growth temperature ranging from room temperature, namely about 20° C., to about 320° C. for a time duration ranging from about 10 seconds to about 600 seconds and then further treated with an annealing procedure with an annealing temperature ranging from about 200° C. to about 400° C. for about 7 to 15 minutes. Test results have shown that annealing with this temperature range and time duration range results in better formation of antimonene sheets. That is, the annealing procedure is capable of re-crystalizing an antimony layer or some antimony impurities into monolayer antimonene.

In an embodiment, second layer 310 includes one or more monolayers of antimonene which have substantially zero contact angle (not shown in FIG. 3 for simplicity) with respect to upper surface 222 of first layer 220 of $MoS_z$.

In an example, the generated antimonene layer 310 is theft allotrope of antimonene.

In example operation 130, a thickness $T_1$ of second layer 310 of the second 2D material is controlled such that second layer 310 exhibits electronic properties suitable for the design and application requirements. In an example, the thickness $T_1$ may be initially controlled by adjusting the time duration of the MBE and/or the TBC procedures. For example, a longer MBE process may obtain a thicker second layer 310 initially, namely more layers of monolayer antimonene. The thickness $T_1$ may be further controlled by a thinning process to reduce the number of layers of the second 2D material.

In an embodiment, second layer 310 of layered antimonene may be thinned through plasma based dry etching, e.g., a reactive-ion etching, to control the electronic properties thereof. In an example, when $T_1$ is equal to or larger than a first threshold, e.g., about 12 angstrom (Å) or three monolayers of antimonene, second layer 310 of antimonene exhibits semimetal properties. When $T_1$ is equal to or smaller than a second threshold, e.g., about 8 angstrom (Å) or two monolayers of antimonene, second layer 310 of antimonene exhibits semiconductor properties. Other bandgap opening techniques, e.g., straining or doping, may be used to transfer semimetallic layers of antimonene into a semiconductor state. The first and second thresholds may vary depending upon the material of second layer 310.

Figure 4:
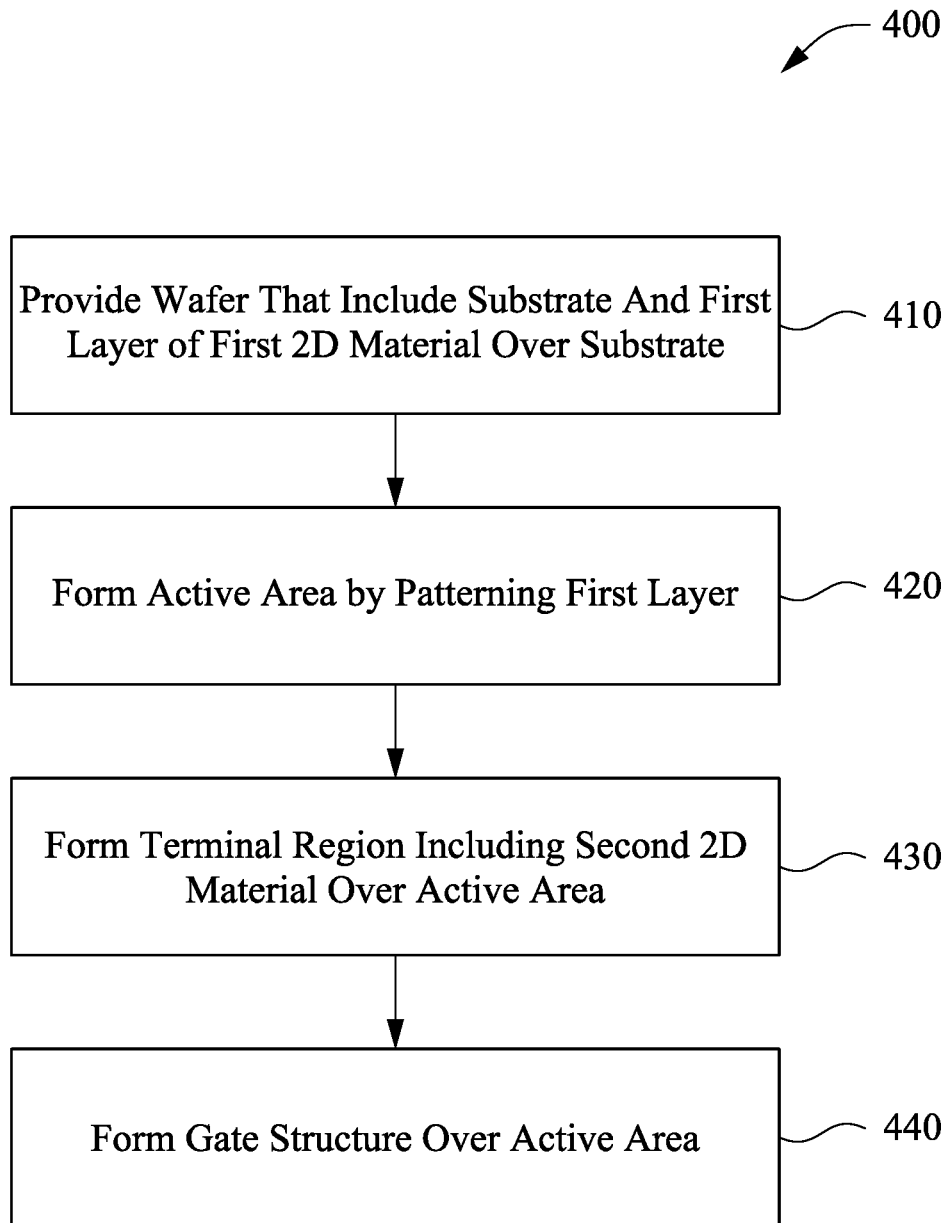
FIG. 4 illustrates an example process of making a semiconductor device including a 2D material according to embodiments of the disclosure.
Figure 5:
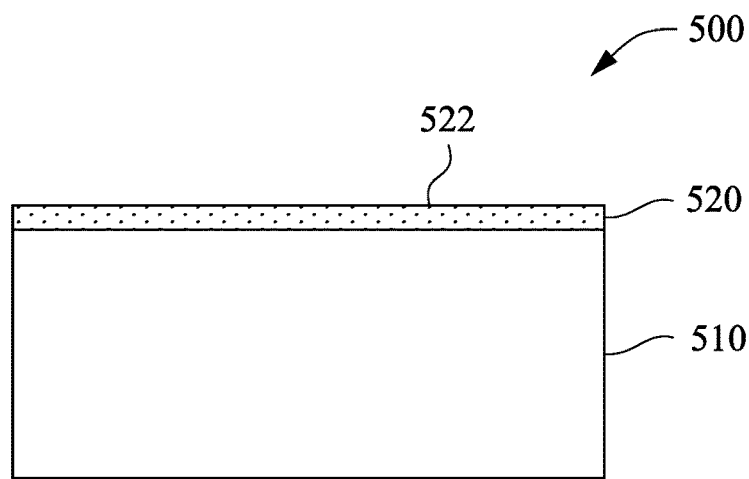
FIGS. 5-8 illustrate cross-sectional views of an example structure at various stages of fabrication according to embodiments of the disclosure.

FIG. 4 illustrates an example process 400 of making a semiconductor device taking advantage of the example process of FIG. 1. Referring to FIG. 4, at example operation 410, with reference also to FIG. 5, a wafer 500 is provided. Wafer 500 includes a substrate 510, e.g., a sapphire substrate, and a first layer 520 of a first 2D material over substrate 510. Wafer 500 may be a same wafer as wafer 200 of FIG. 2.

In an embodiment, first layer 520 of the first 2D material exhibits a semiconductor property. As referred to herein, a semiconductor property of a material or a semiconductor state of a material indicates that for the material or the state of the material, the Fermi level (EF) lies inside a gap between a filled valence band and an empty conduction band, namely a "bandgap," and the bandgap is larger than zero and smaller than 4 electron-volt (eV). As a 2D material may undergo transitions between and/or among semiconductor state, insulator state or semimetal state, the term "bandgap opening" is used herein to refer to a state of the 2D material where a bandgap, direct or indirect, exists in the electronic state of the 2D material such that the 2D material exhibits a semiconductor property. As described herein, the semiconductor state of the first 2D material of first layer 520 may be obtained through one or more of selective formation, thinner/fewer number of monolayers, or other bandgap opening techniques like doping or straining.

In an embodiment, the first 2D material includes a TMD material, e.g., one or more of $MoS_2$ or $MoSe_2$. An upper surface 522 of first layer 520 includes no bonding links in the vertical direction other than the two-dimensional plane (referred to as "vertical bonding") between/among atoms of sulfur (S) for $MoS_2$ or Selenium (Se) for $MoSe_2$.

Figure 6A:
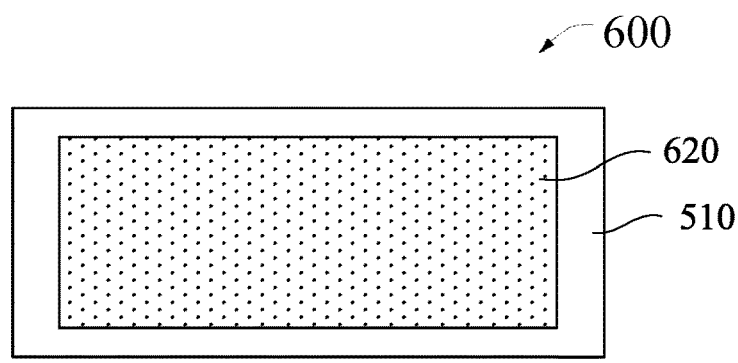
Figure 6B:
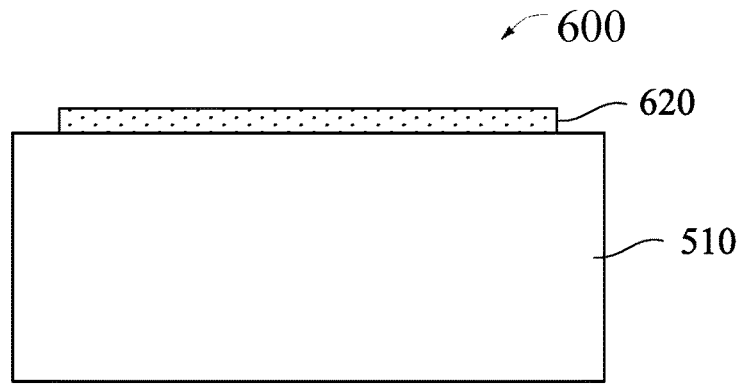

In example operation 420, with reference also to FIG. 6A showing a top view of wafer 600 and FIG. 6B showing a sectional view of wafer 600, one or more active areas 620 are defined by patterning first layer 520. Any suitable patterning approaches may be used and all are included in this disclosure. For example, a lithograph and etching process may be performed to pattern first layer 520 to form active area 620.

In an embodiment, the first 2D material is configured as the semiconductor layer, e.g., channel layer, of a structure. The boundary of active area 620 may be defined by separating an active area 620 from another active area 620 on the level of first layer 520. Additionally or alternatively, insulation bodies, like shallow trench insulation (STI) features (not shown for simplicity) are formed within substrate 510 to further define the boundaries of active area 620.

Figure 7A:
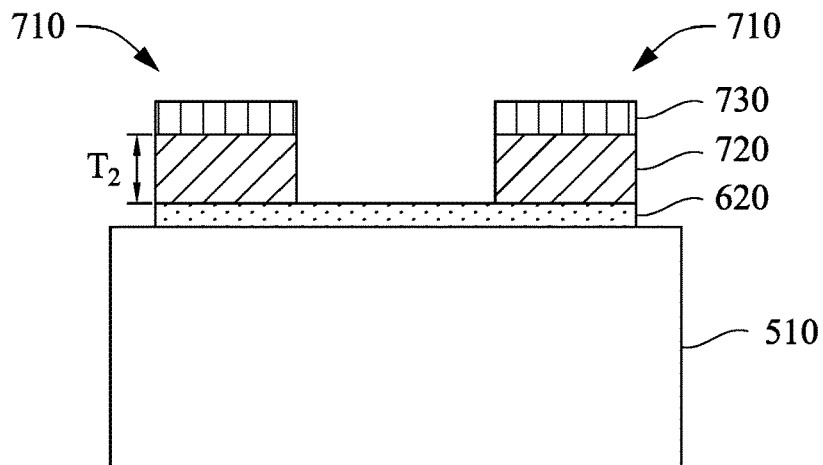
Figure 7B:
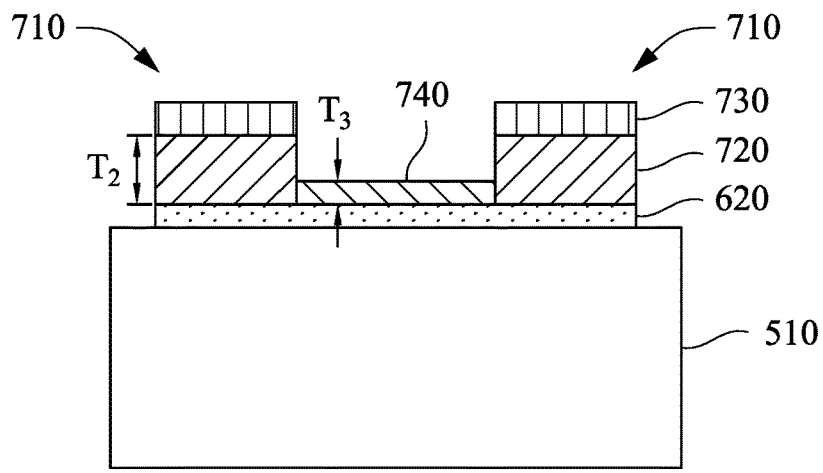

In example operation 430, with reference also to FIGS. 7A and 7B, one or more terminal region 710 (e.g., source/drain region in a field effect transistor) including a second layer 720 of a second 2D material are formed directly over active area 620 of the first 2D material, e.g., $MoS_2$ or $MoSe_2$. In an embodiment, terminal region 710 also includes a terminal electrode layer 730 of a conductive material, e.g., a metal.

In an embodiment, second 2D material layer 720 is formed over active area 620 using the techniques described in FIG. 1. For example, the second 2D material layer 720 is antimonene. The antimonene layer 720 may be deposited over active area 620 of the first 2D material $MoS_2$ or $MoSe_2$ using molecular beam epitaxy (MBE) or physical vapor deposition (PVD) processes with a growth temperature ranging from room temperature to about 320° C. for a time duration ranging from about 10 seconds to about 600 seconds. Alternatively and/or additionally, forming antimonene layer 720 over active area 620 of $MoS_2$ includes growing a layer of antimony over active area 620 of $MoS_2$ or $MoSe_2$ using molecular beam epitaxy (MBE) or physical vapor deposition (PVD) processes under room temperature, e.g., about 20° C., and then annealing the layer of antimony with an annealing temperature ranging from about 200° C. to about 400° C. for about 7 to 15 minutes to form antimonene layer 720. In an embodiment, antimonene layer 720 includes β allotrope antimonene.

Terminal electrode 730, e.g., a source/drain electrode, is formed of any conductive material suitable for forming a conductive electrode, e.g., a metal or metal compound. Suitable metal materials for terminal electrode 730 include ruthenium, palladium, platinum, cobalt, nickel, and/or conductive metal oxides and other suitable materials for P-type metal materials and include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials. Terminal electrode may also include a contact metal like aluminum or copper. The deposition of terminal electrode 730 may be achieved using any now known or future developed approaches, e.g., CVD, PVD, plating, or other suitable process.

In an embodiment, the annealing process, if any, on second layer 720 is performed before the deposition of terminal electrode 730. In another embodiment, the annealing process on second layer 720 is performed after the deposition of terminal electrode 730. For example, layer 720 of antimony may be deposited over first 2D material $MoS_2$ of active area 620. Then, terminal electrode layer 730 (either patterned or not patterned) is deposited over antimony layer 720. After that, an annealing process is performed to crystallize/recrystallize antimony layer 720 into a 2D allotrope, namely antimonene.

Terminal electrode 730 and second layer 720 of antimonene may be patterned together or separately to form terminal region 710. For example, lithography and etching processes may be used to pattern second layer 720 and/or terminal electrode 730. In another example, a lift-off process may be used to pattern second layer 720 and/or terminal electrode 730. Other suitable patterning techniques are also possible and included as part of this disclosure.

In an embodiment, second layer 720 of antimonene exhibits its semimetal properties. For example, a thickness T2 of second layer 720 of antimonene is equal to or larger than a first threshold, e.g., 12 angstrom (Å), such that second layer 720 of antimonene exhibits semimetal properties.

As shown in FIG. 7A, as an embodiment, the patterning of the second layer 720 substantially removes all the second 2D materials, e.g., antimonene, except for terminal regions 710.

In another embodiment, as shown in FIG. 7B, the patterning of the second layer 720 of antimonene also forms a thinner layer 740 of antimonene adjacent to terminal region 710 and over active area 620. Thin layer 740 of antimonene includes a thickness $T_3$. In an embodiment, thickness $T_3$ is equal to or smaller than a second threshold, e.g., 8 angstrom (Å), such that thin layer 740 of antimonene exhibits semiconductor properties. Alternatively or additionally, other bandgap opening techniques, like doping or straining, may be performed on layer 740 of antimonene to make layer 740 exhibit semiconductor properties. Layer 740 is shown in FIG. 7B with a different pattern than layer 720 to indicate that the antimonene monolayers of layer 740 have a different electronic property from that of layer 720??, namely semiconductor v. semimetal.

Figure 8:
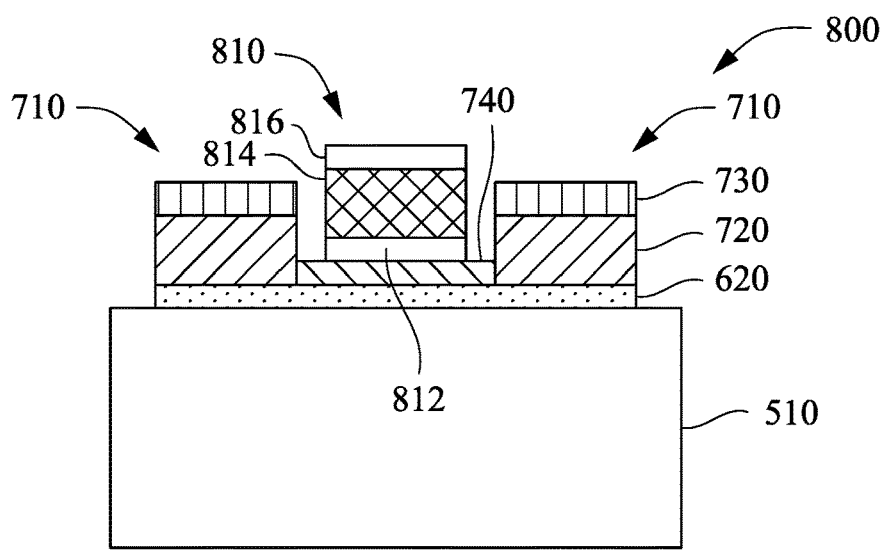

In example operation 440, with reference also to FIG. 8, a gate structure 810 may be formed. Gate structure 810 may include a gate dielectric layer 812, a gate electrode 814 and optionally a gate cap 816. Gate dielectric layer 812 may include a high-k (high dielectric constant) dielectric layer and is formed over active area 620 of first 2D material of semiconductor properties, e.g., MoS$_2$. In example embodiments, high-k dielectric material is selected from one or more of hafnium oxide (HfO2), hafnium silicon oxide (HfSiO), hafnium silicon oxynitride (HfSiON), hafnium tantalum oxide (HfTaO), hafnium titanium oxide (HMO), hafnium zirconium oxide (HfArO), combinations thereof, and/or other suitable materials. A high-K dielectric material includes a dielectric constant value larger than that of thermal silicon oxide (~3.9), and in some applications, may include a dielectric constant (K) value larger than 6. Depending on design requirements, a dielectric material of a dielectric constant (K) value of 7 or higher may be used.

High-K dielectric layer 812 may be formed by atomic layer deposition (ALD) or other suitable technique. In an example, high-K dielectric layer 812 includes a thickness ranging from about 10 to about 30 angstrom (Å) or other suitable thickness depending on design and process requirements/variations.

In example embodiments, optionally, an interfacial layer of thermal or chemical oxide, e.g., BiO$_x$, BiN$_y$, having a thickness ranging from about 5 to about 10 angstrom (Å), no more than 10 angstrom (Å), may be formed between active area 620 of first 2D material MoS$_2$ and high-K dielectric layer 812 using any suitable processes.

Gate electrode 814 may include a metal or a metal compound. Suitable metal materials for gate electrode 114 include ruthenium, palladium, platinum, cobalt, nickel, and/or conductive metal oxides and other suitable P-type metal materials and may include hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable materials for N-type metal materials. In some examples, gate electrode 814 includes a work function layer tuned to have a proper work function for enhanced performance of the field effect transistor devices. For example, suitable n-type work function metals include Ta, TiAl, TiAlN, TaCN, other n-type work function metal, or a combination thereof, and suitable p-type work function metal materials include TiN, TaN, other p-type work function metal, or combination thereof. In some examples, a conductive layer, such as an aluminum layer, is formed over the work function layer such that the gate electrode 814 includes a work function layer disposed over the gate dielectric 812 and a conductive layer disposed over the work function layer and below a gate cap (not shown for simplicity).

Gate structure 810 may be formed using any suitable approaches and all are included in the disclosure. In an embodiment, gate structure 810 is formed through a replacement gate process.

It should be appreciated that the patterning of first layer 520 of MoS$_2$ may be performed after the upper structures, e.g., second layer 720, have been formed.

As shown in FIG. 8, a semiconductor device 800 includes a substrate 510, a channel region 620 (and 740, in an embodiment as shown) over substrate 510, a source/drain structure 710 at least partially over channel region 620, 740, and a gate structure 810 over channel region 620, 740. Channel region 620 includes the first 2D material, e.g., MoS$_2$, that exhibits a semiconductor property. Channel region 740, if any, includes the second 2D material, e.g., antimonene, which exhibits a semiconductor property. Source/drain region 710 includes a conductive source/drain electrode 730 and second layer 720 of the second 2D material, e.g., antimonene, which exhibits a semimetal property. Gate structure 810 includes a gate dielectric layer 812 and a gate electrode 814 over gate dielectric layer 812. In an embodiment, the antimonene layer 720 and/or the antimonene layer 740 include β allotrope of antimonene.

The foregoing outlines features of several embodiments so that those skilled in the art may better understand the aspects of the present description. Those skilled in the art should appreciate that they may readily use the present description as a basis for designing or modifying other processes and structures for carrying out the same purposes and/or achieving the same advantages of the embodiments introduced herein. Those skilled in the art should also realize that such equivalent constructions do not depart from the spirit and scope of the present description, and that they may make various changes, substitutions, and alterations herein without departing from the spirit and scope of the present description.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

In accordance with various embodiments described herein, a second 2D material is grown over a first different 2D material. Taking advantage of the first 2D material having no vertical bondings between/among atoms, the second 2D material is grown with satisfactory monolayer states and in satisfactory scale. The technical disadvantages of conventional antimonene fabrication efforts, e.g., droplet formation, desorption and clustering, are effectively resolved. With properly chosen first 2D material, the technique also simplifies a device fabrication process. A first 2D material having semiconductor properties may be used as a base to deposit a second 2D material. The second 2D material may be formed and/or treated to have semimetal properties. A source/drain region may be formed from the second 2D material layer. The heterostructure of the first 2D material and the second 2D material including a 2D-2D interface between the first 2D material of semiconductor state and the second 2D material of semimetal state. Therefore, the heterostructure does not suffer from metal-semiconductor junction issues and serves as an effective Ohmic contact.

The present disclosure may be further appreciated with the description of the following embodiments:

In a method embodiment, a second layer of a second two-dimensional material is formed over a first layer of a first different two-dimensional material. The first layer is provided as part of a wafer including a substrate and the first layer over the substrate. The first two-dimensional material of the first layer exhibits a semiconductor property.

In another method embodiment, a semiconductor device is fabricated. A wafer is provided, which includes a substrate and a first layer of a first two-dimensional material over the substrate. The first layer of the first two-dimensional material has a semiconductor property. The first layer of the first two-dimensional material is patterned to define an active area. A source/drain region is formed over the active area. The source/drain region includes a second layer of a second different two-dimensional material over the active area of the first two-dimensional material. The second layer of the second two-dimensional material has a semimetal property.

A device embodiment provides a semiconductor structure. The semiconductor structure includes a substrate, a channel region over the substrate, a source/drain structure at least partially over the channel region and a gate structure over the channel region. The channel region includes a first two-dimensional material having a semiconductor property. The source/drain structure includes a second two-dimensional material having a semimetal property. The gate structure includes a gate dielectric and a gate electrode over the gate dielectric.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a first layer of a first two-dimensional material over a substrate, the first two-dimensional material of the first layer having a semiconductor property; and
   forming a second layer of a second two-dimensional material of antimonene over the first layer of the first two-dimensional material, the second two-dimensional material being different from the first two-dimensional material;
   wherein the forming the second layer of antimonene includes:
      growing a layer of antimony over the first layer of the first two-dimensional material; and
      forming the second layer of antimonene by annealing the layer of antimony with an annealing temperature ranging from about 200° C. to about 400° C.

2. The method of claim 1, wherein the first two-dimensional material is a transition metal dichalcogenide (TMD) material.

3. The method of claim 2, wherein the TMD material is molybdenum disulfide.

4. The method of claim 3, wherein the providing the wafer includes:
   depositing a layer of molybdenum over the substrate; and
   forming the two-dimensional molybdenum disulfide from molybdenum in the layer of molybdenum.

5. The method of claim 1, wherein the forming further includes growing the second layer of antimonene with a growth temperature ranging from about 20° C. to about 320° C. for a time duration ranging from about 10 seconds to about 600 seconds.

6. The method of claim 1, wherein the annealing lasts for about 7 to 15 minutes.

7. The method of claim 1, further comprising reducing a thickness of the second layer of the second two-dimensional material.

8. A method, comprising:
   forming a first layer of a first two-dimensional material over a substrate, the first layer of the first two-dimensional material having a semiconductor property;
   defining an active area by patterning the first layer of the first two-dimensional material; and
   forming a source/drain region including a second layer of a second two-dimensional material over the active area of the first layer of the first two-dimensional material, the second layer of the second two-dimensional material having a semimetal property.

9. The method of claim 8, wherein the substrate includes sapphire.

10. The method of claim 8, wherein the first two-dimensional material is molybdenum disulfide.

11. The method of claim 8, wherein the second two-dimensional material is antimonene.

12. The method of claim 11, wherein the forming the source/drain region includes at least one or more of:
    growing the second layer of antimonene with a growth temperature ranging from about 20° C. to about 320° C. for a time duration ranging from about 10 seconds to about 600 seconds; or
    annealing a layer of antimony for about 7 to 15 minutes with an annealing temperature ranging from about 200° C. to about 400° C.

13. The method of claim 12, further comprising forming a conductive contact electrode over the source/drain region, wherein the annealing is conducted after the conductive contact electrode is formed.

14. The method of claim 8, further comprising:
    forming a dielectric layer over the first layer of the first two-dimensional material adjacent to the source/drain region; and
    forming a gate electrode over the dielectric layer, the gate electrode being separated from the first layer of the first two-dimensional material by the dielectric layer.

15. A method, comprising:
    forming a channel region over a substrate, the channel region including a first two-dimensional material of antimonene having a semiconductor property;
    forming a source/drain structure at least partially over the channel region, the source drain structure including a second two-dimensional material having a semimetal property; and
    forming a gate structure over the channel region, the gate structure including a gate dielectric and a gate electrode over the gate dielectric;
    wherein the forming the channel region includes:
       depositing a layer of antimony over a layer of a third two-dimensional material over the substrate, and
       forming the antimonene of the channel region by annealing the layer of antimony with an annealing temperature ranging from about 200° C. to about 400° C.

16. The method of claim 15, wherein the second two-dimensional material is antimonene.

17. The method of claim 16, wherein the second two-dimensional material is a β allotrope of antimonene.

18. The method of claim 15, wherein the third two-dimensional material is molybdenum disulfide.

* * * * *